(12) United States Patent
Sekine et al.

(10) Patent No.: US 10,991,732 B2
(45) Date of Patent: Apr. 27, 2021

(54) DEVICE INCLUDING ELEMENT HAVING RECTIFICATION CHARACTERISTICS AND THIN FILM TRANSISTOR

(71) Applicant: TIANMA JAPAN, LTD., Kanagawa (JP)

(72) Inventors: Hiroyuki Sekine, Kanagawa (JP); Shuhei Nara, Kanagawa (JP); Takayuki Ishino, Kanagawa (JP); Yusuke Yamamoto, Kanagawa (JP)

(73) Assignee: TIANMA JAPAN, LTD., Kanagawa (JP)

( * ) Notice: Subject to any disclaimer, the term of this patent is extended or adjusted under 35 U.S.C. 154(b) by 0 days.

(21) Appl. No.: 16/587,349

(22) Filed: Sep. 30, 2019

(65) Prior Publication Data

US 2020/0111824 A1 Apr. 9, 2020

(30) Foreign Application Priority Data

Oct. 5, 2018 (JP) ............................. JP2018-189931

(51) Int. Cl.
*H01L 27/146* (2006.01)
*H01L 27/24* (2006.01)

(52) U.S. Cl.
CPC .. *H01L 27/14603* (2013.01); *H01L 27/14667* (2013.01); *H01L 27/2409* (2013.01); *H01L 27/2472* (2013.01)

(58) Field of Classification Search
None
See application file for complete search history.

(56) References Cited

U.S. PATENT DOCUMENTS

| 8,067,813 | B2* | 11/2011 | Wright | .............. H01L 27/14665 |
| | | | | 257/444 |
| 9,236,408 | B2* | 1/2016 | Yamazaki | ......... H01L 27/14603 |
| 2004/0041097 | A1 | 3/2004 | Ishii et al. | |
| 2006/0237655 | A1 | 10/2006 | Ishii et al. | |
| 2006/0237656 | A1 | 10/2006 | Ishii et al. | |

* cited by examiner

*Primary Examiner* — Robert K Carpenter
(74) *Attorney, Agent, or Firm* — Sughrue Mion, PLLC

(57) ABSTRACT

A device includes a first element having rectification characteristics that allow electric current to flow from an upper electrode to a lower electrode, an n-channel thin film transistor, and a control electrode. The n-channel thin film transistor includes a semiconductor film, a gate electrode, a first signal electrode, and a second signal electrode. The control electrode faces the gate electrode with the semiconductor film interposed therebetween. The second signal electrode is connected with the lower electrode. The control electrode is connected with the lower electrode. At least a part of a first channel end on the first signal electrode side of the semiconductor film is located within a region of the control electrode, when viewed planarly. A second channel end on the second signal electrode side of the semiconductor film is distant from the control electrode, when viewed planarly.

16 Claims, 14 Drawing Sheets

*COMPARATIVE EXAMPLE*

*COMPARATIVE EXAMPLE*

COMPARATIVE EXAMPLE

DEVICE INCLUDING ELEMENT HAVING RECTIFICATION CHARACTERISTICS AND THIN FILM TRANSISTOR

CROSS-REFERENCE TO RELATED APPLICATIONS

This Non-provisional application claims priority under 35 U.S.C. § 119(a) on Patent Application No. 2018-189931 filed in Japan on Oct. 5, 2018, the entire content of which is hereby incorporated by reference.

BACKGROUND

This disclosure relates to a device including an element having rectification characteristics and a thin film transistor.

Devices including an element having rectification characteristics that allows electric current to flow in substantially only one direction are known. For example, an image sensor includes a pixel array composed of a plurality of pixels each including a photodiode (PD) having rectification characteristics and a thin film transistor (TFT) connected with a lower electrode of the photodiode to control the electric current that flows across the photodiode.

SUMMARY

An aspect of this disclosure is a device including: a first element having rectification characteristics that allow electric current to flow from an upper electrode to a lower electrode; an n-channel thin film transistor including a semiconductor film, a gate electrode, a first signal electrode, and a second signal electrode; and a control electrode facing the gate electrode with the semiconductor film interposed therebetween. The second signal electrode is connected with the lower electrode. The control electrode is connected with the lower electrode. At least a part of a first channel end on the first signal electrode side of the semiconductor film is located within a region of the control electrode, when viewed planarly. A second channel end on the second signal electrode side of the semiconductor film is distant from the control electrode, when viewed planarly.

An aspect of this disclosure is a device including: a first element having rectification characteristics that allow electric current to flow from a lower electrode to an upper electrode; an n-channel thin film transistor including a semiconductor film, a gate electrode, a first signal electrode, and a second signal electrode; and a control electrode facing the gate electrode with the semiconductor film interposed therebetween. The second signal electrode is connected with the lower electrode. The control electrode is connected with the lower electrode. A first channel end on the first signal electrode side of the semiconductor film is distant from the control electrode, when viewed planarly. At least a part of a second channel end on the second signal electrode side of the semiconductor film is located within a region of the control electrode, when viewed planarly.

It is to be understood that both the foregoing general description and the following detailed description are exemplary and explanatory and are not restrictive of this disclosure.

EMBODIMENTS

Hereinafter, embodiments will be described with reference to the accompanying drawings. It should be noted that the embodiments are merely examples to implement this disclosure and are not to limit the technical scope of this disclosure. The drawings may exaggerate the sizes and/or shapes of the elements for clear understanding of the description.

Figure 1A:
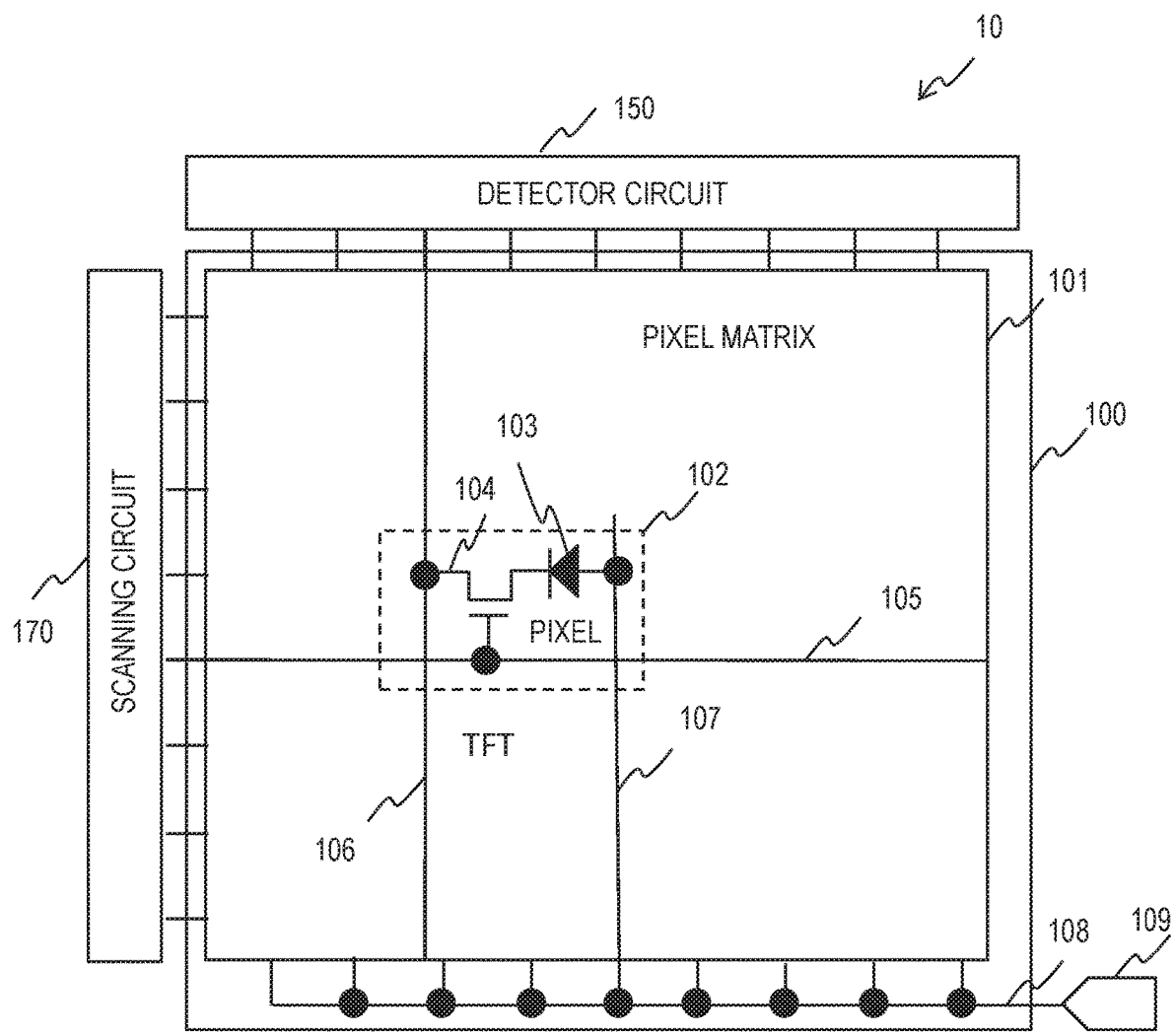
FIG. 1A is a block diagram illustrating a configuration example of an image sensor.

FIG. 1A is a block diagram illustrating a configuration example of an image sensor. An example of the image sensor 10 is used to take an image of transmitted x-rays. The image sensor 10 includes a pixel matrix 101, a scanning circuit 170, and a detector circuit 150. The pixel matrix 101 includes pixels 102 arrayed in a matrix. The pixel matrix 101 is formed on a sensor substrate 100. The sensor substrate 100 is an insulative substrate made of glass, for example.

The pixels 102 are disposed at intersections between a plurality of signal lines 106 and a plurality of gate lines (scanning lines) 105. In FIG. 1A, the signal lines 106 are disposed to extend vertically and be distant horizontally from one another. The gate lines 105 are disposed to extend horizontally and be distant vertically from one another. Each pixel 102 is connected with one of the bias lines 107 disposed to extend vertically and be distant horizontally from one another in FIG. 1A. In FIG. 1A, only one of the pixels, one of the signal lines, one of the gate lines, and one of the bias lines are provided with reference signs 102, 106, 105, and 107, respectively.

Each signal line 106 is connected with a different pixel column. Each gate line 105 is connected with a different pixel row. The signal line 106 is connected with the detector circuit 150 and the gate line 105 is connected with the scanning circuit 170. Each bias line 107 is connected with a common bias line 108. A bias potential is applied to a pad 109 of the common bias line 108.

Figure 1B:
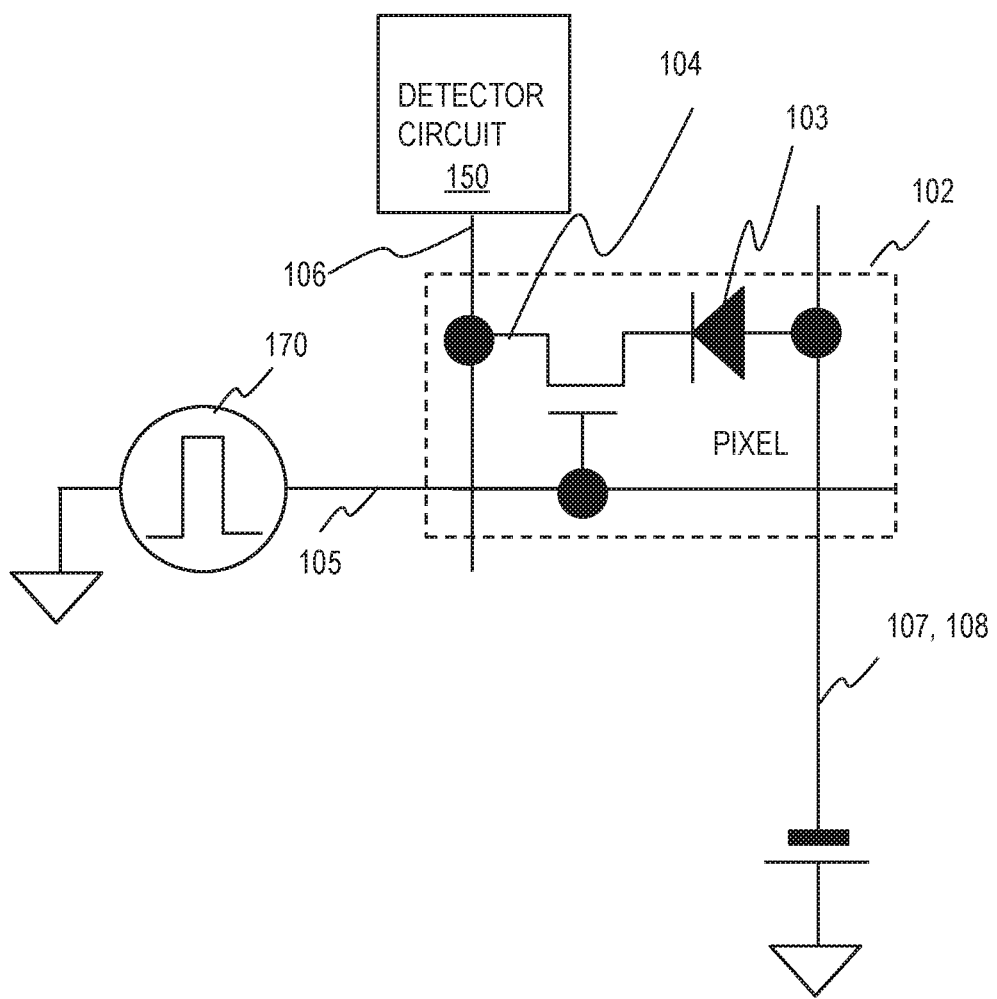
FIG. 1B is a circuit diagram illustrating a configuration example of an equivalent circuit of a pixel.

FIG. 1B is a circuit diagram illustrating a configuration example of an equivalent circuit of a pixel 102. The pixel 102 includes a photodiode 103 as a photoelectric conversion element and a thin film transistor (TFT) 104 as a switching element. The gate terminal of the thin film transistor 104 is connected with a gate line 105 and one of the source/drain terminals is connected with a signal line 106 and the other source/drain terminal is connected with the cathode terminal of the photodiode 103. In the example of FIG. 1B, the anode terminal of the photodiode 103 is connected with a bias line 107.

The thin film transistor 104 is an amorphous silicon (a-Si) thin film transistor or an oxide semiconductor thin film transistor. The thin film transistor 104 has an n-type conductivity. The following description is provided assuming that the thin film transistor 104 is an oxide semiconductor thin film transistor.

The image sensor 10 used as an X-ray imaging device reads a signal by taking out the signal charge stored in proportion to the amount of X-ray irradiation from each photodiode 103 to the external. The signal charge can be taken out by making the thin film transistor 104 for the pixel 102 conductive. Specifically, when light enters a photodiode 103, signal charge is generated and stored in the photodiode 103.

The scanning circuit 170 selects gate lines 105 one by one to apply a pulse to make the thin film transistor 104 conductive. The anode terminal of the photodiode 103 is connected with a bias line 107 and the signal lines 106 are supplied with a reference potential by the detector circuit 150. Accordingly, the photodiode 103 is charged to a difference voltage between the bias potential of the bias line 107 and the reference potential. This difference voltage is determined so that the cathode potential is higher than the anode potential to reverse-bias the photodiode 103.

The charge required to recharge the photodiode 103 to the reverse bias voltage depend on the amount of light incident on the photodiode 103. The detector circuit 150 reads the signal charge by integrating the current that flows until the photodiode 103 is recharged to the reverse bias voltage.

The charge stored in the photodiode 103 inevitably decreases because of incident light and dark leakage current that flows even when the photodiode 103 is not irradiated with light. Accordingly, in the thin film transistor 104 in the operation of reading signal charge, the voltage at the terminal connected with the signal line 106 is equal to or higher than the voltage at the terminal connected with the photodiode 103. That is to say, the terminal connected with the signal line 106 is the drain and the terminal connected with the photodiode 103 is the source in detecting signal charge.

Figure 2A:
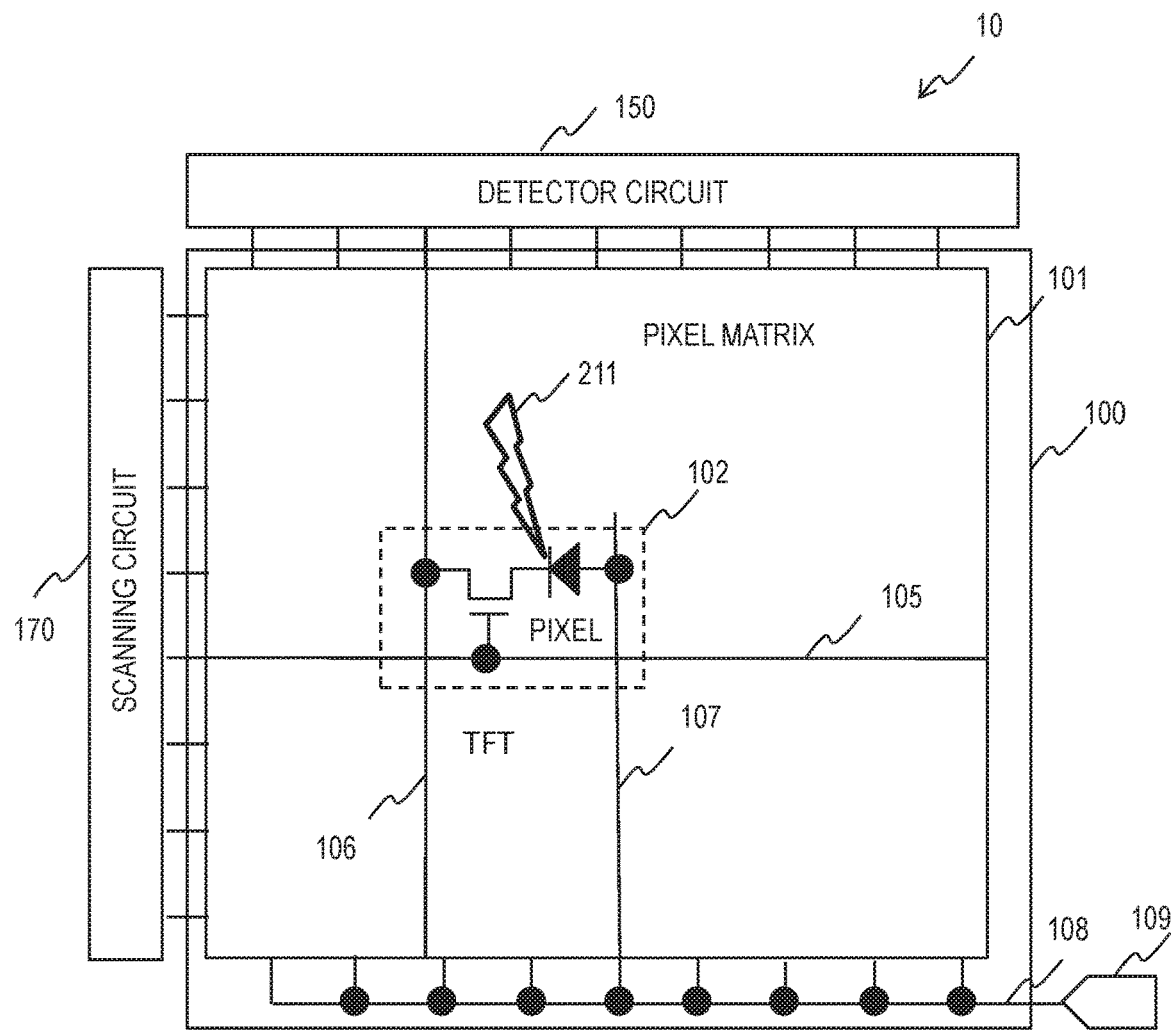
FIG. 2A is a diagram illustrating electrostatic damage to a photodiode and a thin film transistor of a pixel.
Figure 2B:
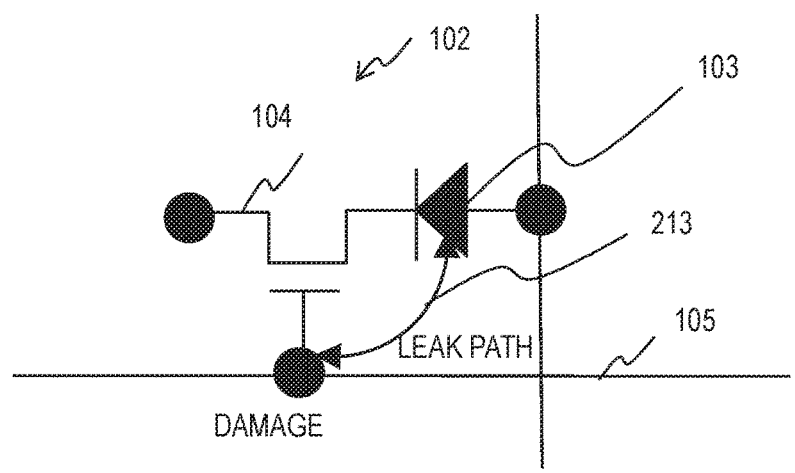
FIG. 2B is a diagram illustrating electrostatic damage to a photodiode and a thin film transistor of a pixel.

With reference to FIGS. 2A and 2B, electrostatic damage to the photodiode 103 and the thin film transistor 104 of a pixel is described. As illustrated in FIG. 2A, charge 211 of static electricity could be injected to the junction between the photodiode 103 and the thin film transistor 104 in manufacturing an image sensor 10. As a result of the electrostatic damage to the photodiode 103 and the thin film transistor 104, a leak path 213 is generated as illustrated in FIG. 2B.

Figure 3A:
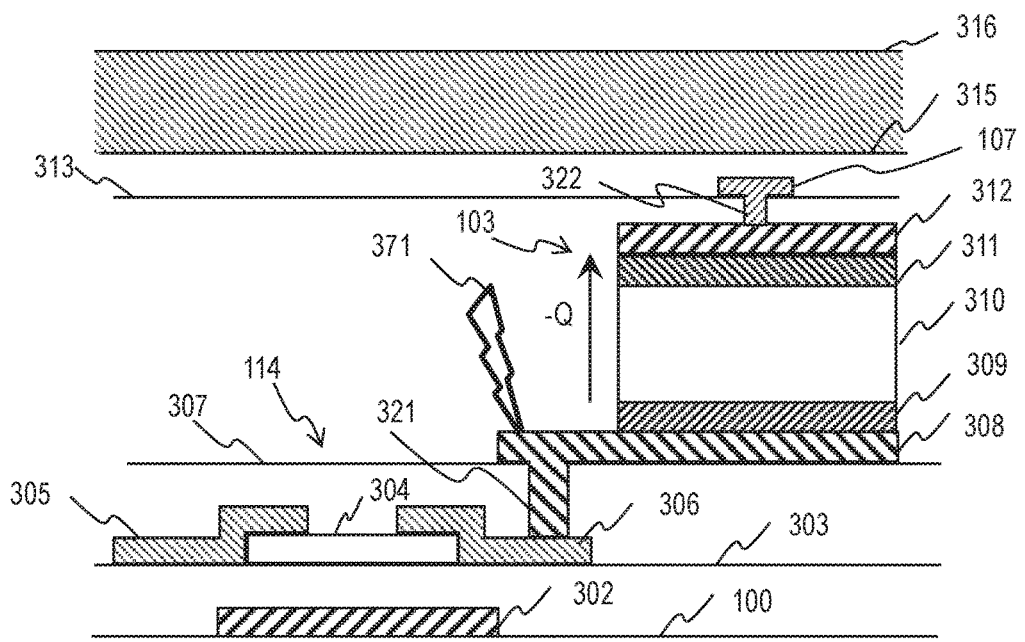
FIG. 3A illustrates a behavior of the charge of static electricity in a pixel in a comparative example.
Figure 3B:
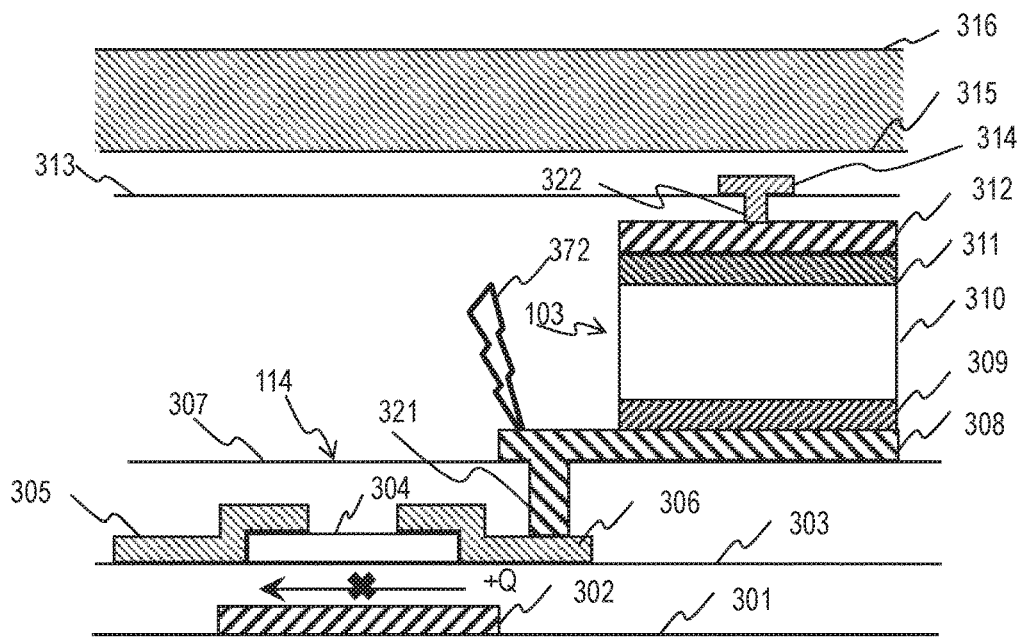
FIG. 3B illustrates a behavior of the charge of static electricity in a pixel in a comparative example.

FIGS. 3A and 3B illustrate behaviors of the charge of static electricity within a pixel of a comparative example. FIG. 3A illustrates a cross-sectional structure of a pixel when negative charge of static electricity is injected to the lower electrode of the photodiode 103. FIG. 3B illustrates a cross-sectional structure of the pixel when positive charge of static electricity is injected to the lower electrode of the photodiode 103.

In the following description, the side of the image sensor 10 where the object to be measured is placed is referred as front side. In the example of FIGS. 3A and 3B, the side opposite to the sensor substrate 100 of the photodiode 103 is the front side. In the positional relations among the constituents of a pixel, the side closer to the sensor substrate 100 is referred to as lower side and the opposite side is referred to as upper side.

The thin film transistor 114 and the photodiode 103 included in a pixel have laminate structures. The thin film transistor 114 includes a gate electrode 302 formed above an insulative sensor substrate 100, a gate insulating layer (film) 303 above the gate electrode 302, and an oxide semiconductor layer (film) 304 above the gate insulating layer 303.

The thin film transistor 114 in FIGS. 3A and 3B has a bottom-gate structure; the gate electrode 302 is provided lower than the oxide semiconductor layer 304. The thin film transistor 114 further includes a source/drain electrode (first signal electrode) 305 and a source/drain electrode (second signal electrode) 306 above the gate insulating layer 303. The source/drain electrodes 305 and 306 are connected with the oxide semiconductor layer 304. The source/drain electrodes 305 and 306 are in contact with the side faces of the island-like oxide semiconductor layer 304 and further, parts of the top face of the oxide semiconductor layer 304.

One of the source/drain electrodes 305 and 306 is a source electrode and the other one is a drain electrode depending on the flow of the carriers. In detecting the charge of the photodiode 103, the electrode 305 is a drain electrode and the electrode 306 is a source electrode. In releasing the charge of static electricity, which will be described later, the electrode 305 is a source electrode and the electrode 306 is a drain electrode.

The gate insulating layer 303 is provided to fully cover the gate electrode 302. The gate insulating layer 303 is provided between the gate electrode 302 and the oxide semiconductor layer 304, between the gate electrode 302 and the source/drain electrode 305, and between the gate electrode 302 and the source/drain electrode 306.

A first interlayer insulating layer (film) 307 is provided to cover the entire thin film transistor 114. Specifically, the first interlayer insulating layer 307 covers the top face of the oxide semiconductor layer 304 and the top faces of the source/drain electrodes 305 and 306.

The sensor substrate 100 is made of glass or resin, for example. The gate electrode 302 is a conductor and can be made of a metal or silicon doped with impurities. The gate insulating layer 303 can be made of silicon oxide or silicon nitride. The oxide semiconductor for the oxide semiconductor layer 304 is an oxide semiconductor including at least one of In, Ga, and Zn, such as amorphous InGaZnO (a-InGaZnO) or microcrystalline InGaZnO. Other oxide semiconductors such as a-InSnZnO and a-InGaZnSnO can also be employed.

The source/drain electrodes 305 and 306 are conductors and can be made of a metal such as Mo, Ti, Al, or Cr, an alloy thereof, or a laminate of these metals or alloys. The first interlayer insulating layer 307 is an inorganic or organic insulator. Although the thin film transistor 114 illustrated in FIGS. 3A and 3B has a bottom-gate structure, the thin film transistor 114 can have a top-gate structure instead.

The photodiode 103 is provided above the first interlayer insulating layer 307. The example of the photodiode 103 illustrated in FIGS. 3A and 3B is a PIN diode. The PIN diode has a thick depletion layer in the film thickness to detect light efficiently. The photodiode 103 includes a semiconductor laminate sandwiched between a lower electrode 308 above the first interlayer insulating layer 307 and an upper electrode 312. The lower electrode 308 is connected with the source/drain electrode 306 of the thin film transistor 114 through the interconnector in a via hole 321 of the first interlayer insulating layer 307.

The lower electrode 308 is a conductor and can be made of a metal such as Cr, Mo, or Al, an alloy thereof, or a laminate of these metals or alloys. The upper electrode 312 is a transparent electrode that transmits light from a scintillator 316 and can be made of ITO, for example.

The photodiode 103 includes an n-type amorphous silicon layer (film) 309 above the lower electrode 308, an intrinsic amorphous silicon layer (film) 310 above the n-type amorphous silicon layer 309, a p-type amorphous silicon layer (film) 311 above the intrinsic amorphous silicon layer 310. The upper electrode 312 is provided above the p-type amorphous silicon layer 311. The light to be detected enters the photodiode 103 through the upper electrode 312 (the p-type amorphous silicon layer 311).

A second interlayer insulating layer (film) 313 is provided to cover the photodiode 103. Specifically, the second interlayer insulating layer 313 is provided above the first interlayer insulating layer 307, a part of the lower electrode 308, and the upper electrode 312. The second interlayer insulating layer 313 is an inorganic or organic insulator.

A bias line 107 is provided above the second interlayer insulating layer 313. The bias line 107 is connected with the upper electrode 312 through an interconnector provided in a via hole 322 of the second interlayer insulating layer 313. The bias line 107 is a conductor and can be made of a metal such as Mo, Ti, or Al, an alloy thereof, or a laminate of these metals or alloys.

A passivation layer (film) 315 is provided to cover the bias line 107 and the second interlayer insulating layer 313. The passivation layer 315 fully covers the pixel matrix 101. The passivation layer 315 is an inorganic or organic insulator. A scintillator 316 is provided above the passivation layer 315.

The scintillator 316 fully covers the pixel matrix 101. The scintillator 316 emits light by being excited by radioactive rays. Specifically, the scintillator 316 converts the received x-rays into light having a wavelength detectable for the photodiode 103. The photodiode 103 stores signal charge in the amount depending on the light from the scintillator 316.

When negative charge (−Q) of static electricity 371 is injected to the lower electrode 308 of the photodiode 103 as illustrated in FIG. 3A, the negative charge goes out to the external through the photodiode 103 and the bias line 107 because of the rectification characteristics of the photodiode. Accordingly, the photodiode 103 and the thin film transistor 114 are not damaged by the negative charge.

However, when positive charge (+Q) of static electricity 372 is injected to the lower electrode 308 of the photodiode 103 as illustrated in FIG. 3B, the positive charge does not go out to the external through either photodiode 103 or the thin film transistor 114, meaning there is no path to release the positive charge. Accordingly, the photodiode 103 and the thin film transistor 114 could be damaged by the positive charge.

As understood from the description with reference to FIGS. 3A and 3B, preparing a path to release the positive charge can save the photodiode 103 and the thin film transistor 114 from damage by static electricity. The image sensor 10 in this embodiment includes a control electrode having a specific structure to enable the charge of static electricity to go out from the thin film transistor without significantly interfering with the detector circuit 150 detecting the charge generated by the object to be measured.

Figure 4:
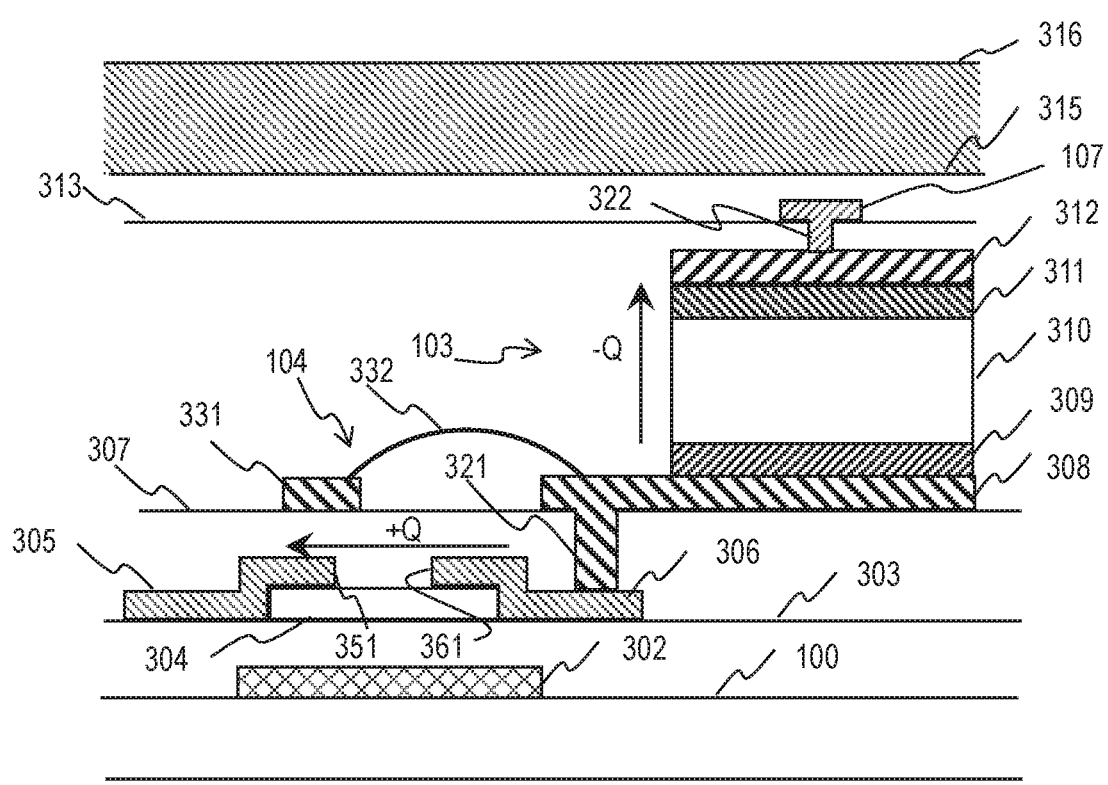
FIG. 4 schematically illustrates a cross-sectional structure of a pixel in an embodiment.

FIG. 4 schematically illustrates a cross-sectional structure of a pixel 102 in an embodiment of this disclosure. The pixel 102 in this embodiment further includes a control electrode 331, compared to the comparison example illustrated in FIGS. 3A and 3B. The control electrode 331 is a constituent of the thin film transistor 104. As will be described later, the control electrode 331 enables positive charge to flow out from the lower electrode 308 of the photodiode 103 to the signal line 106 through the thin film transistor 104.

The control electrode 331 is provided above the first interlayer insulating layer 307. When viewed planarly (when viewed from the top of FIG. 4 or in the laminating direction), the control electrode 331 covers the end 351 of the electrode 305 of the thin film transistor 104 that faces the electrode 306. The control electrode 331 overlaps the electrode 305 and the oxide semiconductor layer 304 with the first interlayer insulating layer 307 interposed therebetween. In contrast, the control electrode 331 is distant from the end 361 of the electrode 306 of the thin film transistor 104 that faces the electrode 305, when viewed planarly.

The gate electrode 302 overlaps the electrode 305, the electrode 306, and the oxide semiconductor layer 304; specifically, the end 351 of the electrode 305, the end 361 of the electrode 306, and the part of the oxide semiconductor layer 304 therebetween are located within the region of the gate electrode 302, when viewed planarly. When the example of FIG. 4 is viewed planarly, the entire oxide semiconductor layer 304 is located within the region of the gate electrode 302. The gate electrode 302 does not need to overlap the entire semiconductor layer 304.

Figure 5:
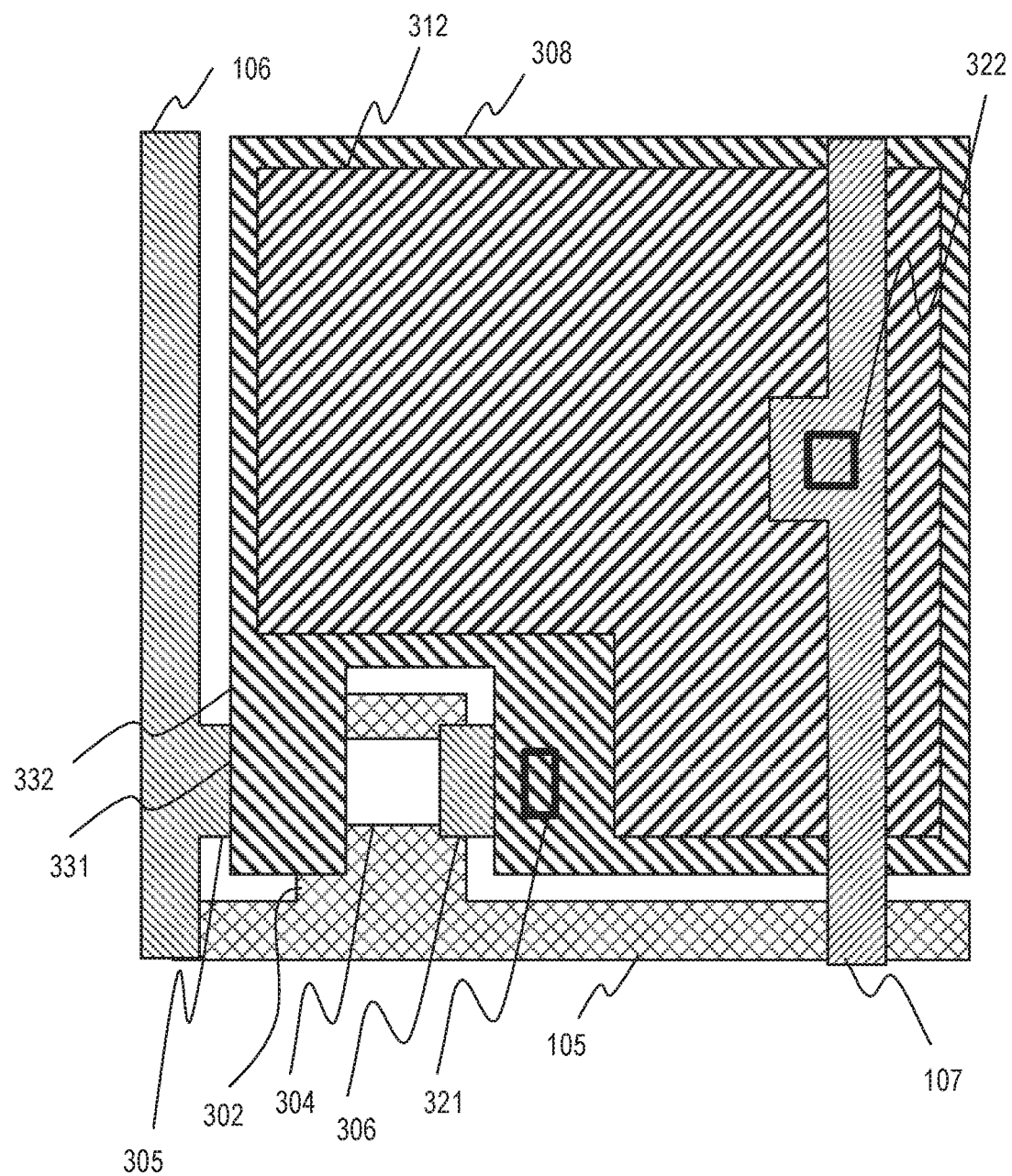
FIG. 5 is a plan diagram of a pixel in the embodiment.
Figure 6:
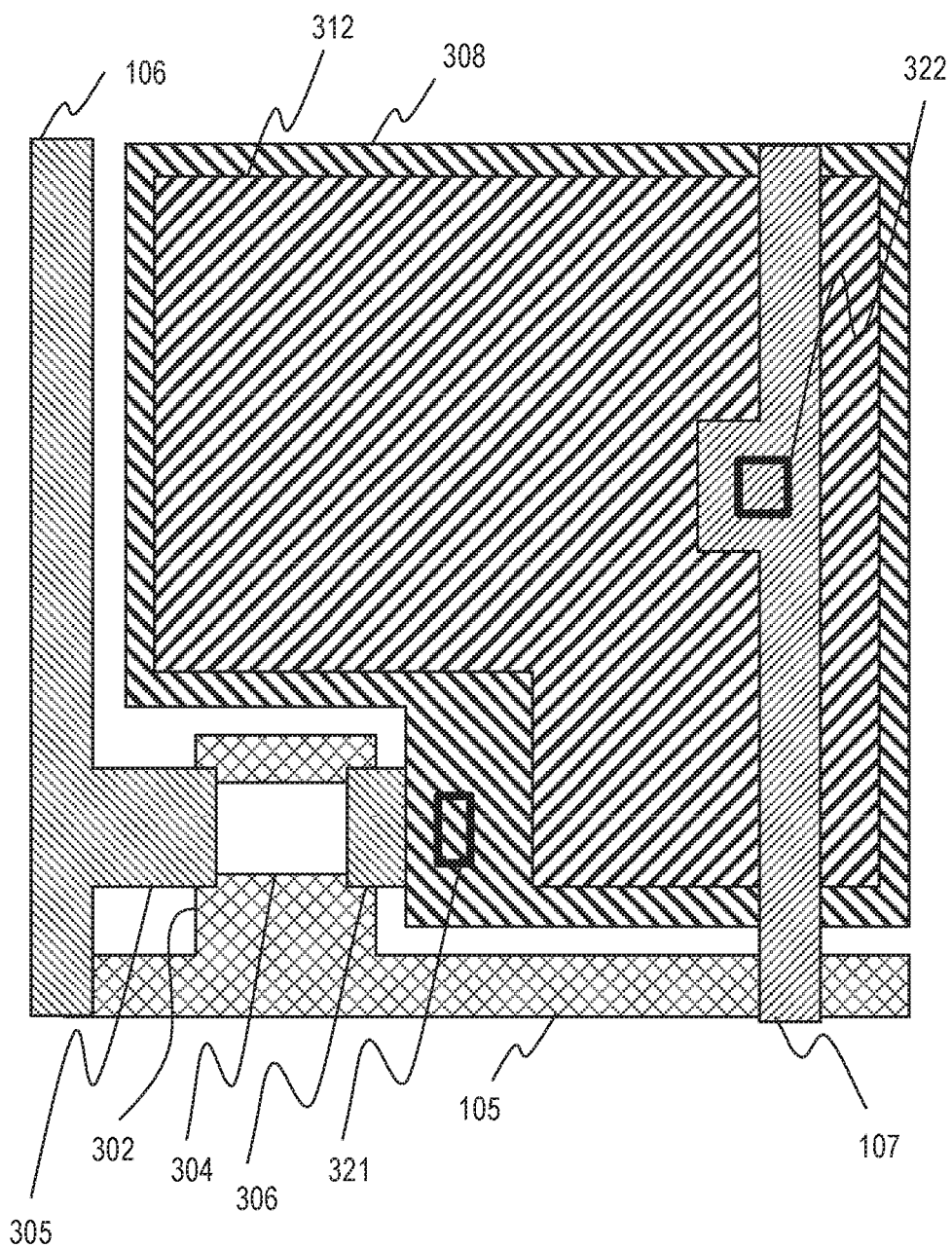
FIG. 6 is a plan diagram of a pixel of a comparative example.

The control electrode 331 is connected with the lower electrode 308 of the photodiode 103 to be maintained at the same potential. FIG. 5 is a plan diagram of a pixel 102 in this embodiment. FIG. 6 is a plan diagram of a pixel of a comparative example. The configurations of these pixels are the same, except for the control electrode 331 and a connector part 332 connecting the control electrode 331 and the lower electrode 308 of the photodiode 103.

As illustrated in FIG. 5, the gate line 105 extends from the left to the right of FIG. 5 and the signal line 106 extends from the top to the bottom of FIG. 5. The gate electrode 302 is unseparated from the gate line 105; these are parts of an unseparated metal film. The gate electrode 302 is projecting from the gate line 105 perpendicularly to the direction in which the gate line 105 extends.

The source/drain electrode 305 of the thin film transistor is unseparated from the signal line 106; these are parts of an unseparated metal film. The source/drain electrode 305 is projecting from the signal line 106 perpendicularly to the direction in which the signal line 106 extends. The source/drain electrode 306 is an island-like electrode and is distant from the source/drain electrode 305.

The oxide semiconductor layer 304 is disposed to overlap the gate electrode 302, when viewed planarly. The source/drain electrode 305 is disposed on one side of the oxide semiconductor layer 304 and the source/drain electrode 306 is disposed on the opposite side. The source/drain electrode 306 is partially covered with the lower electrode 308 of the photodiode 103 and is connected with the lower electrode 308 through a via hole 321.

The control electrode 331 continues to the lower electrode 308 via a connector part 332. The control electrode 331 and the lower electrode 308 are formed of the same material and on the same layer. Specifically, the control electrode 331, the connector part 332, and the lower electrode 308 are parts of an unseparated metal film; they are prepared simultaneously through the same processes (metal film formation and patterning thereof).

The control electrode 331 overlaps the source/drain electrode 305 and the oxide semiconductor layer 304 in such a manner that the control electrode 331 covers the part connecting the source/drain electrode 305 and the oxide semiconductor layer 304. The control electrode 331 is distant from the source/drain electrode 306, when viewed planarly. The control electrode 331 can be made of a material different from the material for the lower electrode 308.

When the example of FIG. 5 is viewed planarly, the entire upper electrode 312 of the photodiode 103 is within the region of the lower electrode 308. A bias line 107 extends from the bottom to the top of FIG. 5. The bias line 107 overlaps the upper electrode 312 and is connected with the upper electrode 312 through a via hole 322.

Figure 7A:
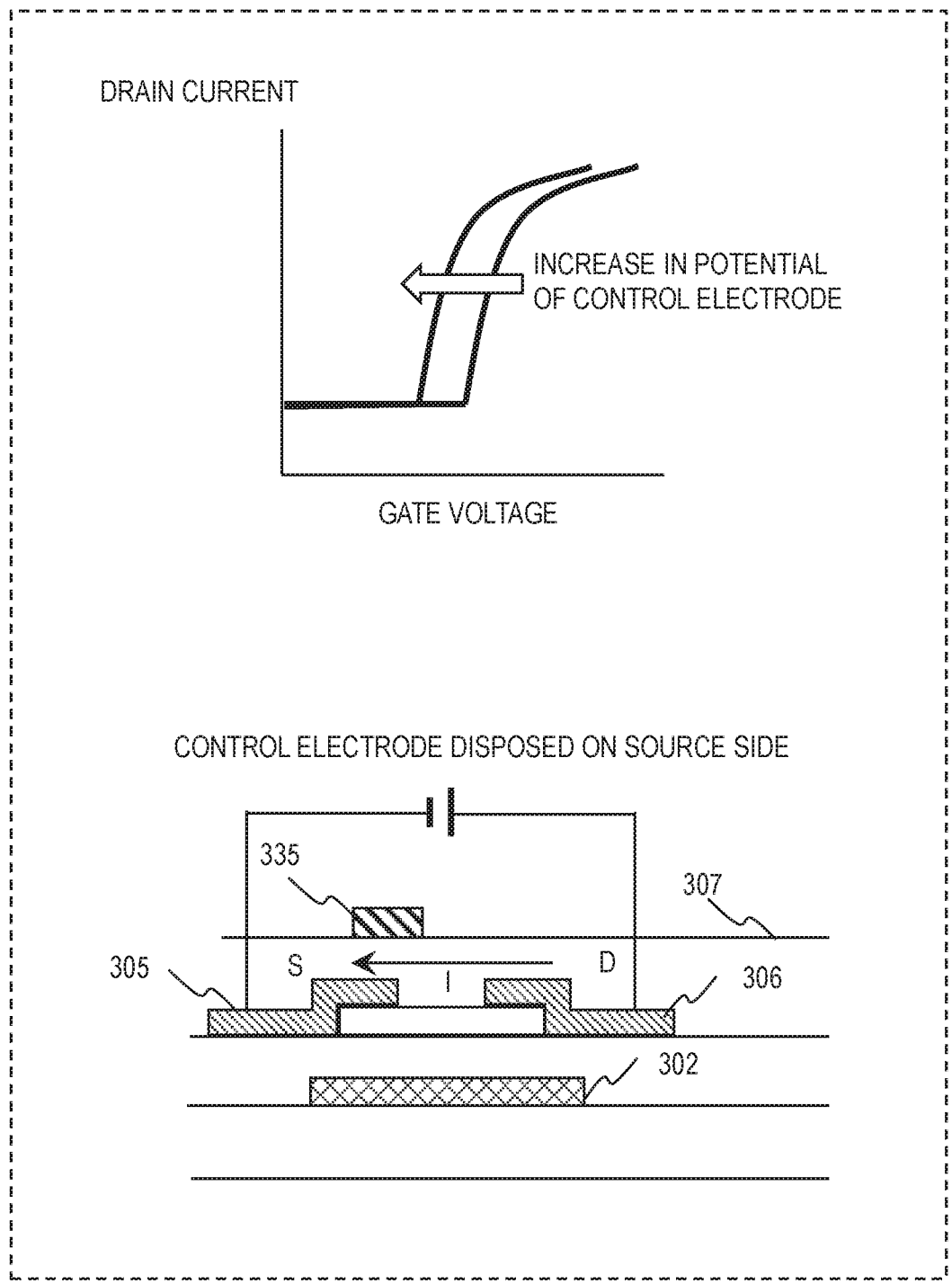
FIG. 7A is a diagram illustrating the function of a control electrode disposed on the source side of the thin film transistor.
Figure 7B:
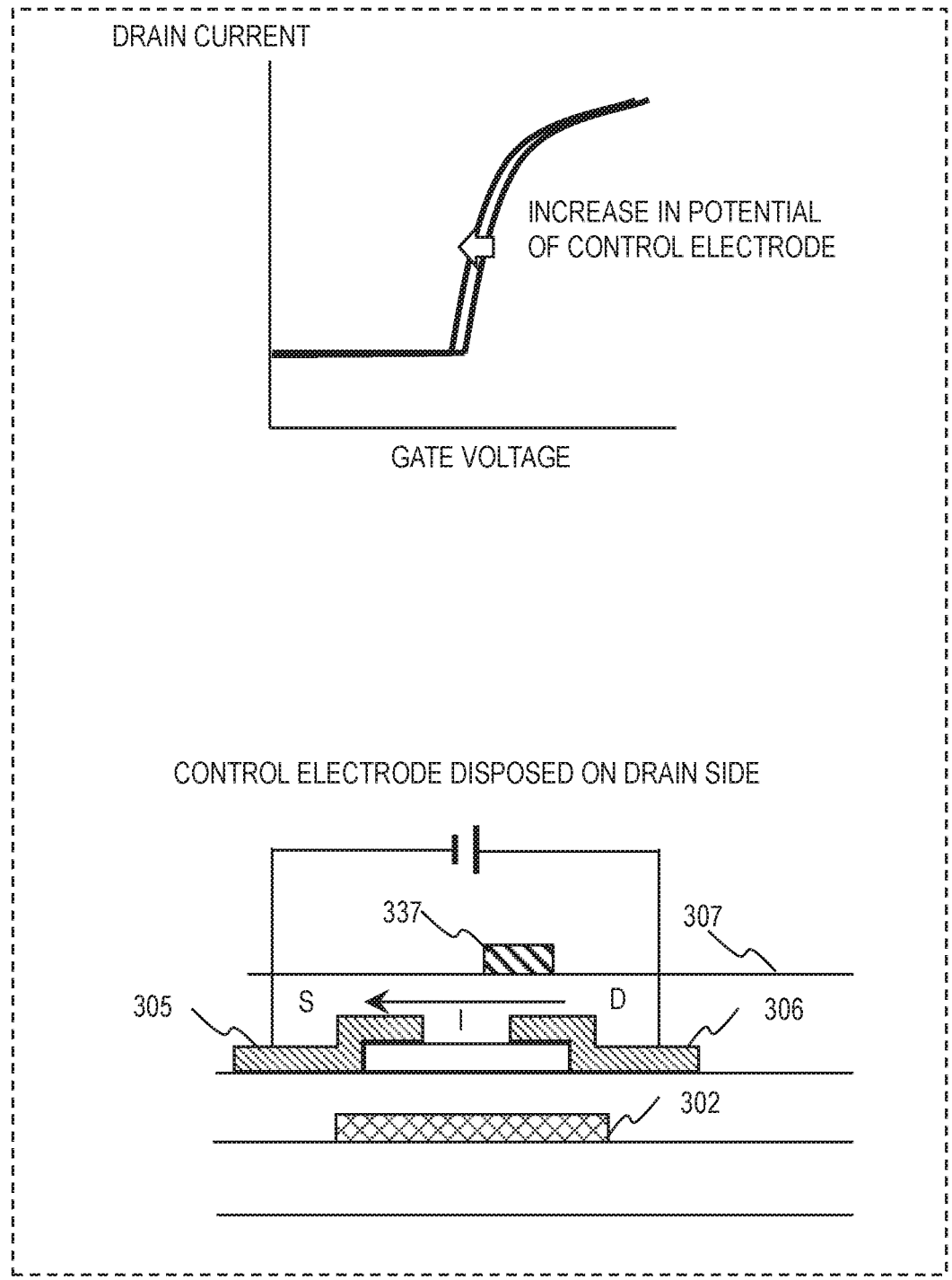
FIG. 7B is a diagram for illustrating the function of a control electrode disposed on the drain side of the thin film transistor.

Next, the functions of the control electrode 331 is described. FIG. 7A is a diagram illustrating the function of a control electrode 335 disposed on the source side of the thin film transistor. FIG. 7B is a diagram illustrating the function of a control electrode 337 disposed on the drain side of the thin film transistor. As illustrated in FIG. 7A, when the control potential applied to the control electrode 335 disposed on the source side is increased, the gate threshold voltage Vth of the thin film transistor decreases significantly.

As illustrated in FIG. 7B, however, the gate threshold voltage Vth of the thin film transistor decreases a little even when the control potential applied to the control electrode 337 disposed on the drain side is increased. As noted from these drawings, the variations in gate threshold voltage Vth are significantly different depending on whether the control electrode is disposed on the source side or the drain side. The characteristics shown in FIGS. 7A and 7B are observed notably on oxide semiconductor thin film transistors.

Figure 8A:
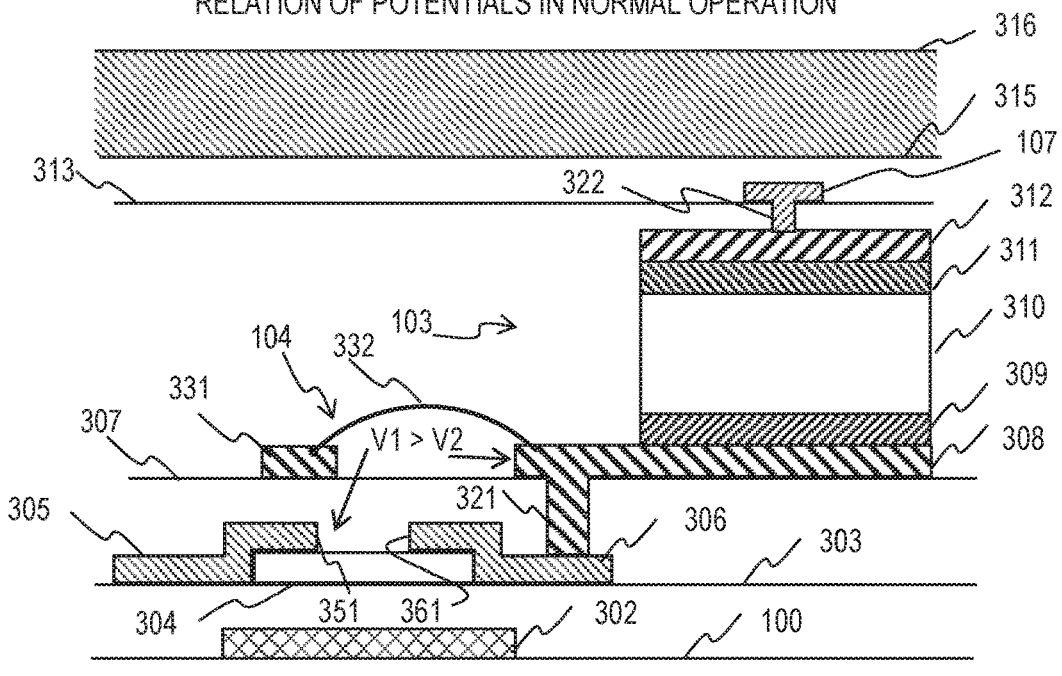
FIG. 8A illustrates a relation between the potential V1 at an electrode of the thin film transistor and the potential V2 at the lower electrode of the photodiode in measuring the charge stored in the photodiode.
Figure 8B:
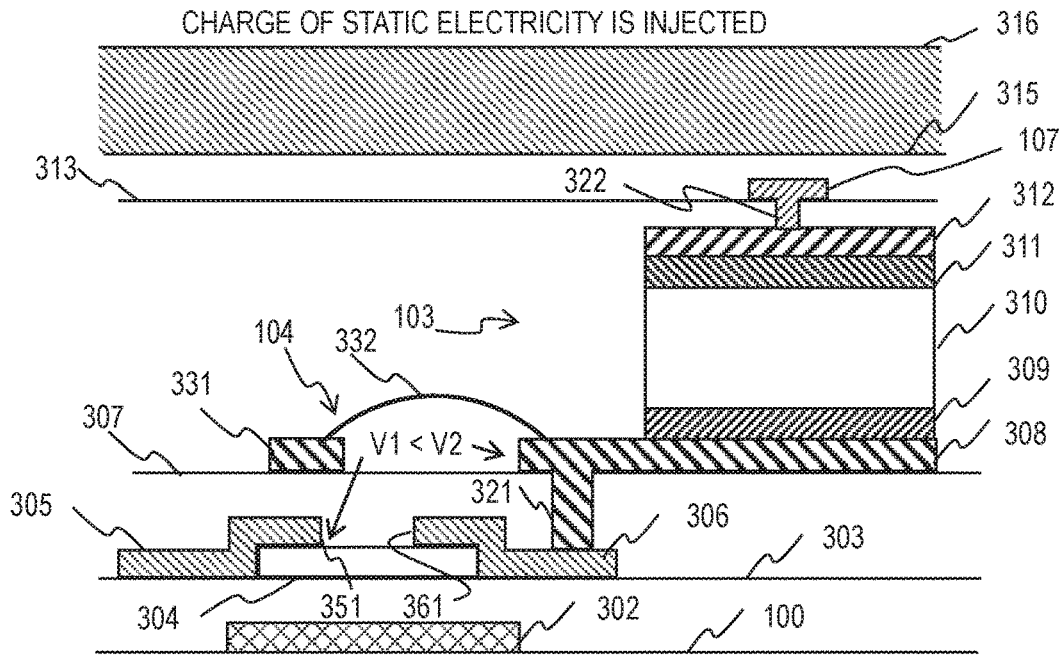
FIG. 8B illustrates a relation of the potentials when positive charge of static electricity is injected to the lower electrode of the photodiode.

FIGS. 8A and 8B illustrate relations of the potentials in a pixel 102 in this embodiment. FIG. 8A illustrates a relation between the potential V1 at the electrode 305 of the thin film transistor 104 and the potential V2 at the lower electrode 308 of the photodiode 103 in normal operation, which is to measure the charge stored in the photodiode 103. The potential V1 at the electrode 305 is higher than the potential V2 at the lower electrode 308. That is to say, the electrode 305 is a drain electrode and the electrode 306 connected with the lower electrode 308 is a source electrode.

FIG. 8B illustrates a relation of the potentials when positive charge of static electricity is injected to the lower electrode 308 of the photodiode 103. As described with reference to FIGS. 3A and 3B, positive charge of static electricity is stored to the lower electrode 308. Accordingly, the potential V1 at the electrode 305 is lower than the potential V2 at the lower electrode 308. That is to say, the electrode 305 is a source electrode and the electrode 306 connected with the lower electrode 308 is a drain electrode.

As described with reference to FIG. 7A, when the potential of the control electrode disposed on the source side increases, the gate threshold voltage of the thin film transistor decreases. As described with reference to FIG. 8B, in the case where positive charge of static electricity is injected to the lower electrode 308 of the photodiode 103, the electrode 305 is a source electrode.

Therefore, the control electrode 331 is located on the source side of the thin film transistor 104. Furthermore, the control electrode 331 has a positive potential in relation to the source electrode 305 because the control electrode 331 has the same potential as the lower electrode 308. Accordingly, the gate threshold voltage Vth of the thin film transistor 104 is lowered significantly because of the potential of the control electrode 331, so that the positive charge injected to the lower electrode 308 is released to the signal line 106 through the thin film transistor 104.

In contrast, the control electrode disposed on the drain side does not affect the gate threshold voltage very much as described with reference to FIG. 7B. As described with reference to FIG. 8A, the electrode 305 in normal operation is a drain electrode. That is to say, the control electrode 331 is disposed on the drain side of the thin film transistor 104. Accordingly, in the normal operation, the gate threshold voltage Vth varies a little because of the control electrode 331, which does not interfere with the detector circuit 150 reading a signal.

As described above, in operating the image sensor 10 normally, the electrode 305 of the thin film transistor 104 connected with the signal line 106 becomes a drain electrode. However, when the pixel 102 is supplied with positive charge of static electricity, the electrode 306 of the thin film transistor 104 connected with the photodiode 103 becomes a drain electrode. As a result of providing the control electrode 331 only on the side of the electrode 305, the gate threshold voltage Vth of the thin film transistor 104 varies little in normal operation and varies largely only when the photodiode 103 is supplied with positive charge.

In summary, the pixel structure of this embodiment lowers the gate threshold voltage of the thin film transistor to release the charge only when positive charge of static electricity is injected but changes the gate threshold voltage a little to attain small interference in reading a signal during normal operation.

Figure 9A:
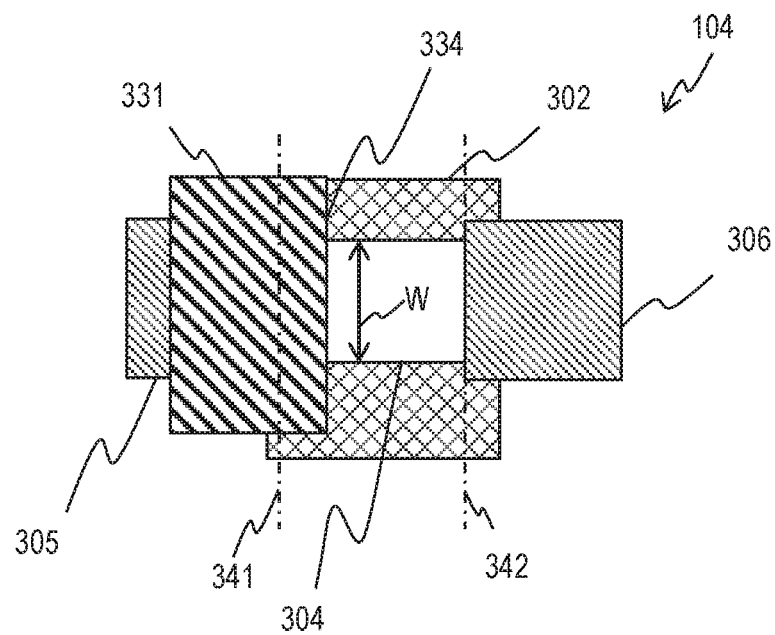
FIG. 9A is a plan diagram of a thin film transistor.
Figure 9B:
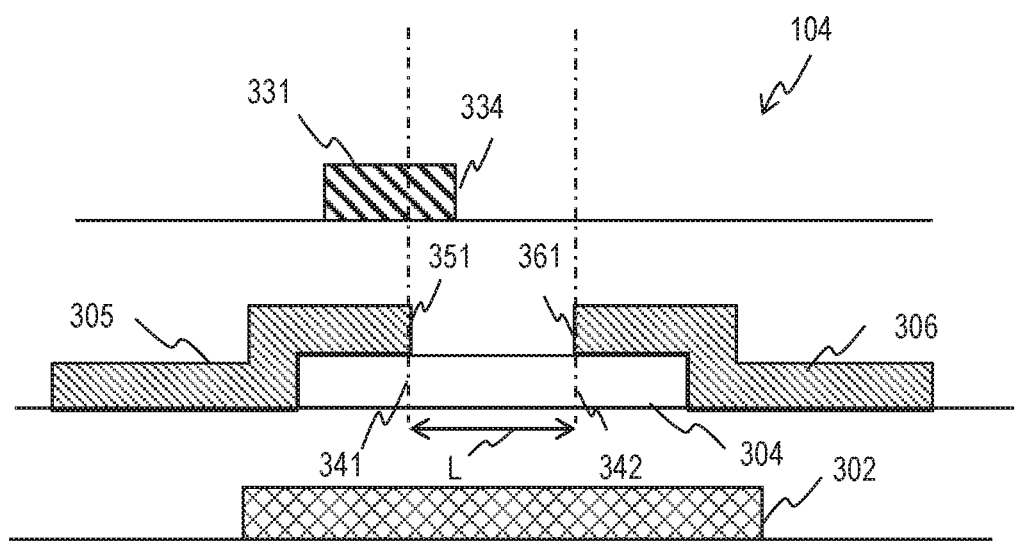
FIG. 9B is a cross-sectional diagram of the thin film transistor.

Next, the structure of the thin film transistor 104 including the control electrode 331 is described in detail. FIG. 9A is a plan diagram of the thin film transistor 104. FIG. 9B is a cross-sectional diagram of the thin film transistor 104. The oxide semiconductor layer 304 has a channel width W and a channel length L. The channel is defined by a channel end 341, which is an end of the region where the oxide semiconductor layer 304 is in contact with the source/drain electrode 305, and a channel end 342, which is an end of the region where the oxide semiconductor layer 304 is in contact with the source/drain electrode 306. The oxide semiconductor layer 304 is not doped with impurities; the locations of the channel ends 341 and 342 coincide with the locations of the end 351 of the source/drain electrode 305 and the end 361 of the source/drain electrode 306.

The control electrode 331 is disposed to cover the channel end 341 and be distant from the channel end 342, when viewed planarly (in the laminating direction). To lower the gate threshold voltage Vth of the thin film transistor 104, raising the potential at the channel end of the source is important. Covering the channel end 341 with the control electrode 331 enables positive charge of static electricity to be released effectively.

To unfailingly cover the channel end 341 with the control electrode 331, the control electrode 331 in the example illustrated in FIGS. 9A and 9B overlaps both the electrode 305 and the oxide semiconductor layer 304. In the example illustrated in FIG. 9A, the control electrode 331 covers the entire channel end 341 from end to end. This configuration effectively releases positive charge of static electricity. The control electrode 331 may partially cover the channel end 341 in another example.

The control electrode 331 does not cover but is distant from the other channel end 342. This configuration achieves small interference in reading a signal in normal operation. In an example, the end 334 of the control electrode 331 is located closer to the electrode 305 than the center of the channel. That is to say, the end 334 is closer to the channel end 341 than to the channel end 342. This configuration effectively reduces the interference in reading a signal.

The control electrode 331 is effective especially for an oxide semiconductor thin film transistor. Oxide semiconductor generates very small positive leakage current and transmits very little positive charge of static electricity unless the control electrode 331 is provided. For this reason, the possibility of electrostatic damage to the photodiode 103 and the thin film transistor 104 increases. Meanwhile, oxide semiconductor exhibits high carrier mobility; the control electrode 331 effectively releases positive charge of static electricity from the oxide semiconductor layer 304.

In a configuration different from the foregoing example such that the semiconductor layer includes regions having high carrier density as a source and a drain, the channel is defined between the source region having high carrier density and the drain region having high carrier density and the boundaries of the regions are the positions where the carrier density changes.

Other Configuration Examples

Figure 10:
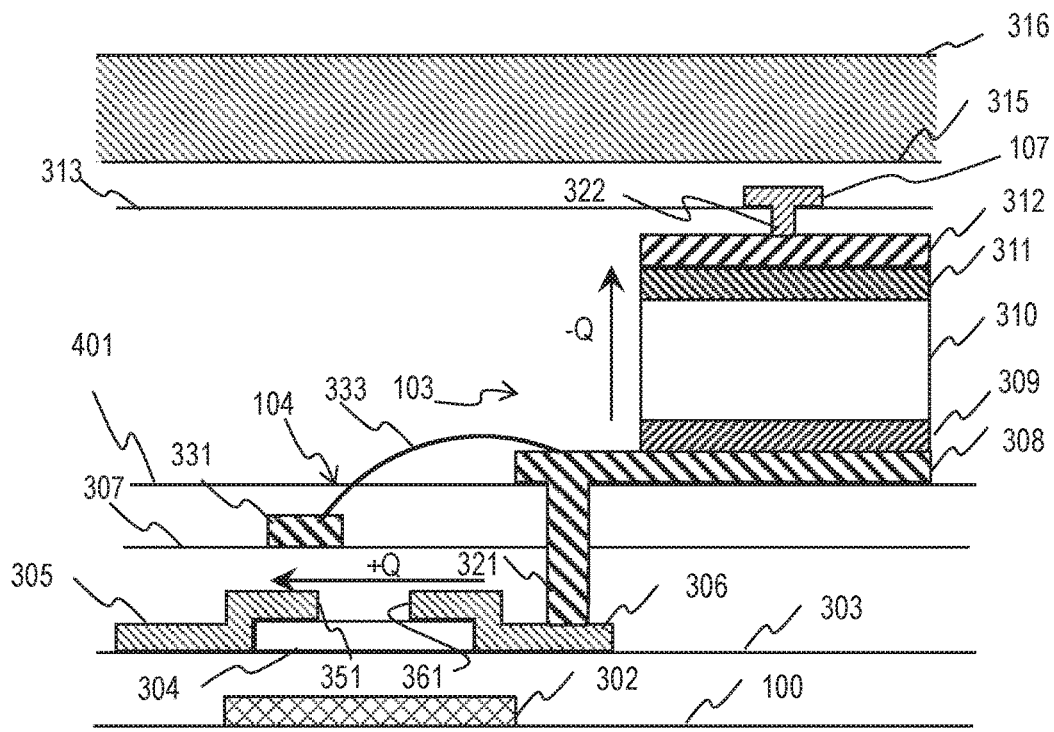
FIG. 10 illustrates another configuration example of a pixel.

Hereinafter, other configuration examples are described. FIG. 10 illustrates another configuration example of a pixel 102. Differences from the configuration in FIG. 4 are mainly described. The control electrode 331 of the thin film transistor 104 is a metal layer provided lower than the lower electrode 308 of the photodiode 103 and closer to the oxide semiconductor layer 304 than the lower electrode 308.

Specifically, a third interlayer insulating layer (film) 401 is provided above the control electrode 331. The third interlayer insulating layer 401 is provided above the control electrode 331 and the first interlayer insulating layer 307 to cover the control electrode 331. The lower electrode 308 of the photodiode 103 is provided above the third interlayer insulating layer 401. The control electrode 331 is connected with the lower electrode 308 through a connector part 333 including a conductive part provided in a via hole of the third interlayer insulating layer 401.

Providing the control electrode 331 closer to the oxide semiconductor layer 304 increases the shift amount of the gate threshold voltage; positive charge of static electricity is released through the thin film transistor 104 even at a low voltage.

Figure 11:
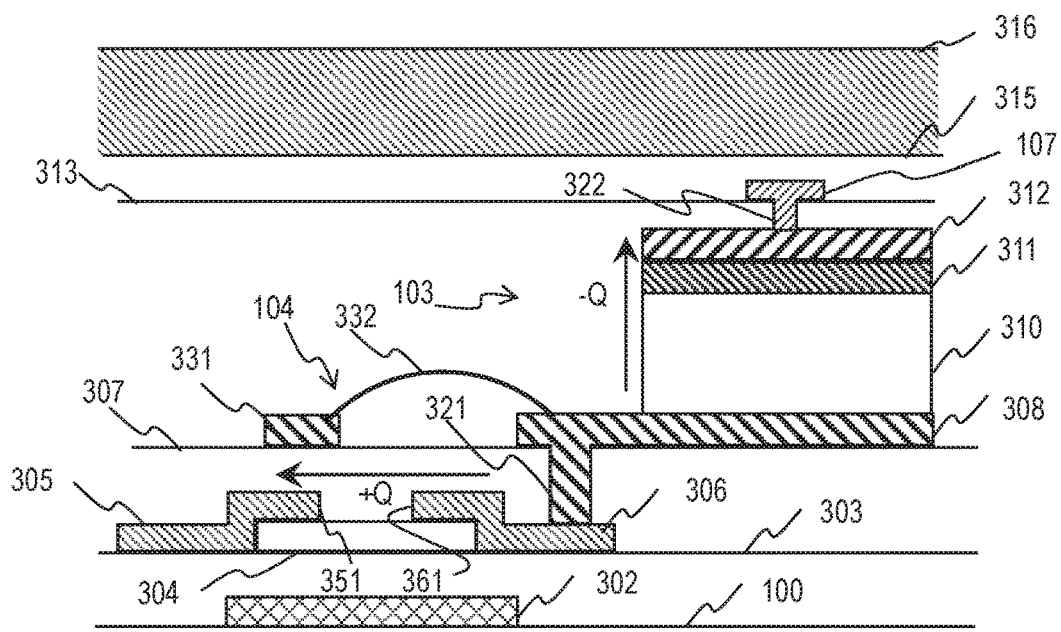
FIG. 11 illustrates still another configuration example of a pixel.

FIG. 11 illustrates still another configuration example of a pixel 102. Differences from the configuration in FIG. 4 are mainly described. The photodiode 103 is a Schottky diode. A Schottky diode is a photodiode that utilizes Schottky effect occurring at the joint between a metal and a semiconductor. The n-type amorphous silicon layer 309 included in the configuration example in FIG. 4 is omitted in this diode 103.

In an image sensor 10 employing a Schottky diode, the control electrode 331 also effectively prevents electrostatic damage to the thin film transistor 104 and the photodiode 103.

Figure 12:
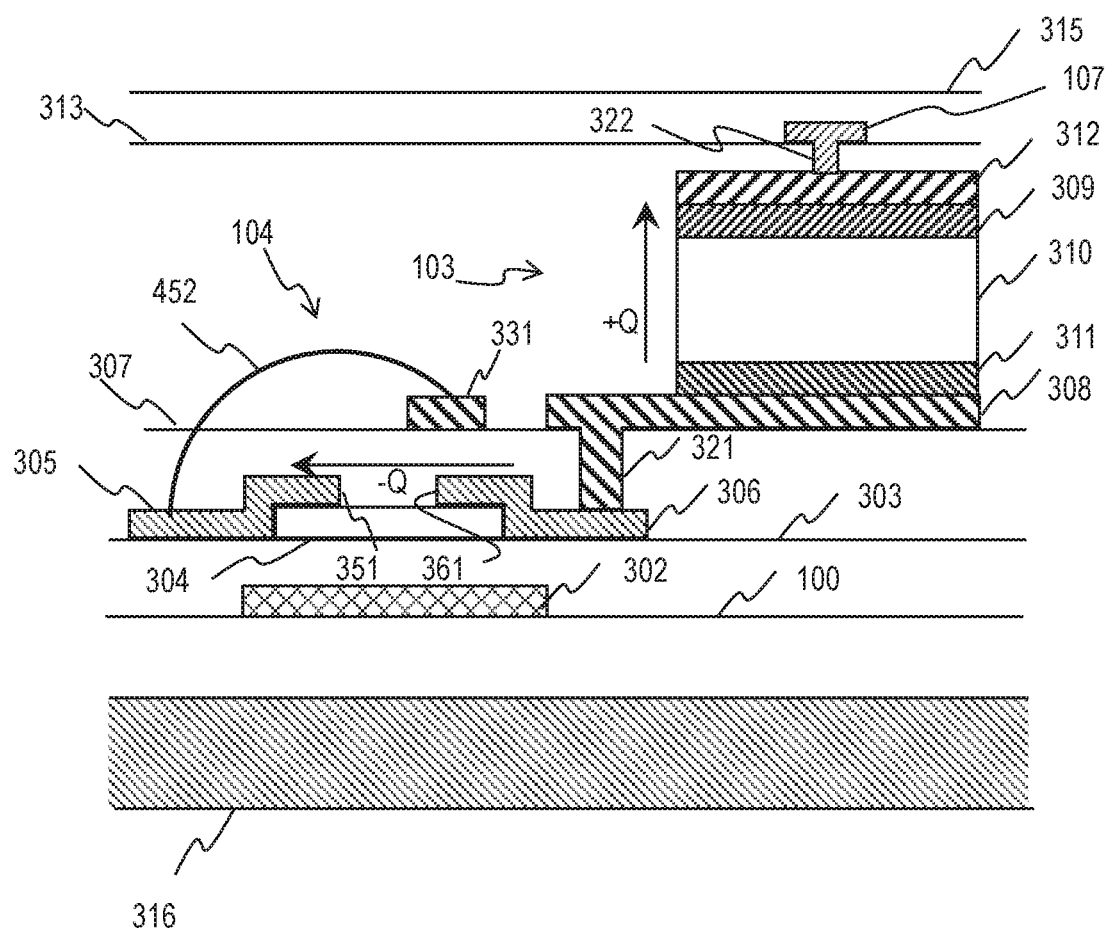
FIG. 12 is a cross-sectional diagram of a pixel having another configuration.
Figure 13:
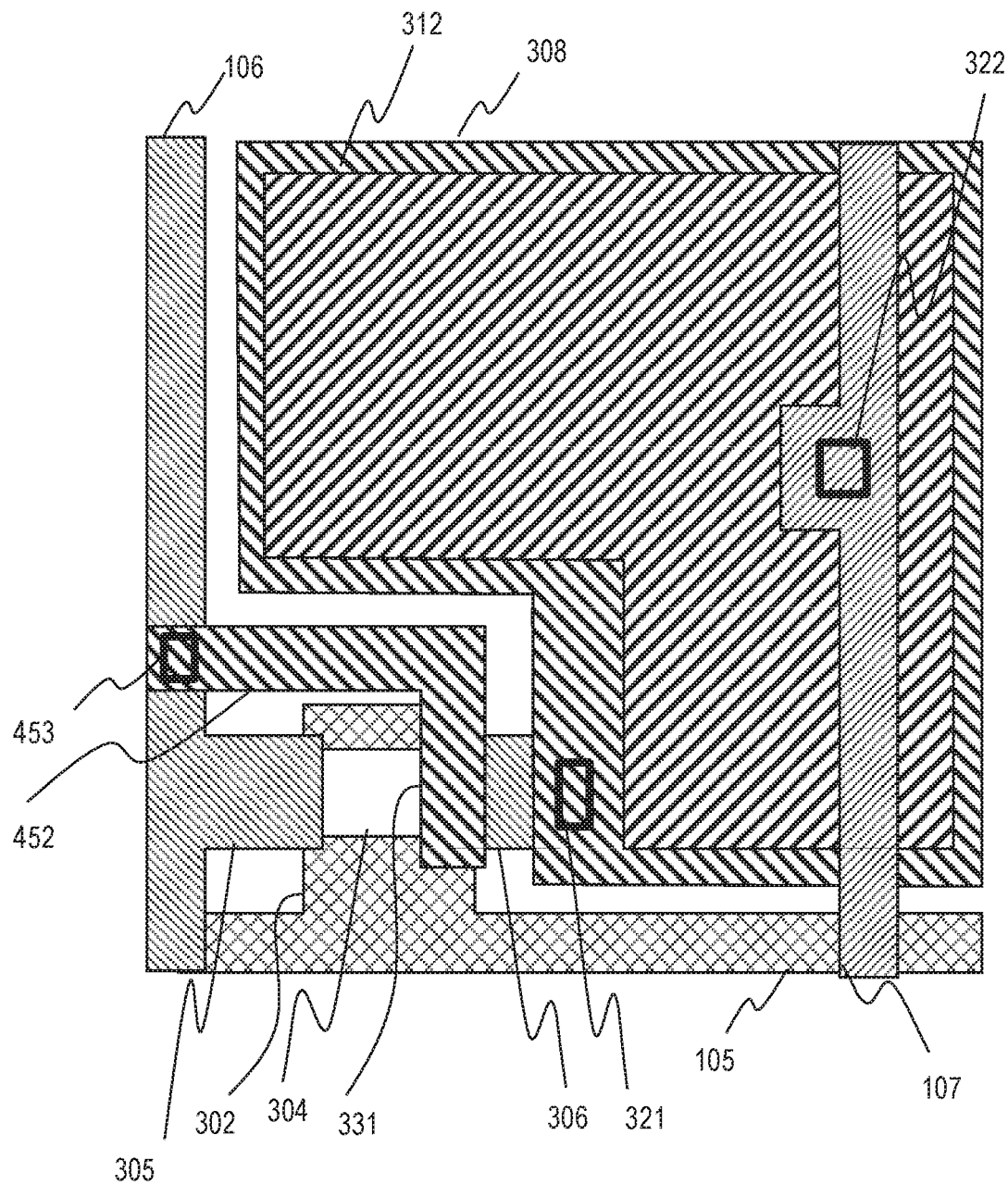
FIG. 13 is a plan diagram of the pixel illustrated in FIG. 12.

FIGS. 12 and 13 illustrate still another configuration example of a pixel 102. Differences from the configuration in FIG. 4 are mainly described. FIG. 12 is a cross-sectional diagram of the pixel 102 and FIG. 13 is a plan diagram of the pixel 102. As illustrated in FIG. 12, the photodiode 103 in this configuration example is different from the photodiode 103 in the configuration example in FIG. 4 in the order of lamination. Specifically, the n-type amorphous silicon layer 309 is interchanged with the p-type amorphous silicon layer 311.

In other words, the p-type amorphous silicon layer 311 is located between the lower electrode 308 and the intrinsic amorphous silicon layer 310 and the n-type amorphous silicon layer 309 is located between the intrinsic amorphous silicon layer 310 and the upper electrode 312. The scintillator 316 is provided on the undersurface of the sensor substrate 100. The front of the image sensor 10 illustrated in FIG. 12 is the bottom of the drawing. The object to be measured is placed under the sensor substrate 100.

The light from the scintillator 316 excited by the X-rays from the object to be measured enters the p-type amorphous silicon layer 311 through the lower electrode 308. The lower electrode 308 is a transparent electrode for the light from the scintillator 316 and can be made of ITO, for example. The upper electrode 312 can be made of a metal such as Cr, Mo, or Al, an alloy thereof, or a laminate of these metals and alloys.

The control electrode 331 is provided on the side of the source/drain electrode 306 of the thin film transistor 104. Specifically, the control electrode 331 covers the end 361 of the electrode 306 of the thin film transistor 104, when viewed planarly. The control electrode 331 overlaps the electrode 306 and the oxide semiconductor layer 304 with the first interlayer insulating layer 307 interposed therebetween. However, the control electrode 331 is distant from the end 351 of the electrode 305 of the thin film transistor 104, when viewed planarly.

As understood from the description provided with reference to FIGS. 9A and 9B, the control electrode 331 is disposed to cover the channel end 342 and be distant from the channel end 341, when viewed planarly (in the laminating direction). Although the control electrode 331 in this example covers the entire channel end 342 from end to end, the control electrode 331 may partially cover the channel end 342 in another example. The control electrode 331 does not cover but is distant from the other channel end 341. In an example, an end of the control electrode 331 is located closer to the electrode 306 than the center of the channel.

The control electrode 331 is connected with the electrode 305 of the thin film transistor 104 through a connector part 452 to be maintained at the same potential as the electrode 305. As illustrated in FIG. 13, the control electrode 331 and the connector part 452 are unseparated and they are parts of an unseparated metal film. The control electrode 331 and the connector part 452 are formed of the same material and on the same layer as the lower electrode 308. The control electrode 331 and the connector part 452 can be prepared simultaneously with the lower electrode 308 through the same processes.

The connector part 452 is connected with the electrode 305 of the thin film transistor 104 through a via hole 453 provided in the first interlayer insulating layer 307. The control electrode 331 and the connector part 452 can be made of the same material as the lower electrode 308 of the photodiode 103 or a different material.

Next, the functions of the control electrode 331 is described. The polarities in the operation of the pixel 102 of this example are opposite to the polarities in the operation described with reference to FIGS. 8A and 8B. When positive charge (+Q) of static electricity is injected to the lower electrode 308 of the photodiode 103, the positive charge goes out to the external through the photodiode 103. Accordingly, the photodiode 103 and the thin film transistor 104 are not damaged by the positive charge.

However, when negative charge (−Q) of static electricity is injected to the lower electrode 308 of the photodiode 103, the negative charge cannot go out from the photodiode 103 to the external. When negative charge is stored in the lower electrode 308, the potential of the electrode 305 is higher than the potential of the electrode 306. Accordingly, the electrode 305 is a drain electrode and the electrode 306 is a source electrode.

The control electrode 331 is at the same potential as the electrode 305, which is higher than the potential of the electrode 306. The electric field of the control electrode 331 acts on the channel end 342 to lower the gate threshold voltage of the thin film transistor 104. Because of the lowered gate threshold voltage, the negative charge stored in the lower electrode 308 flows through the oxide semiconductor layer 304.

In detecting signal charge in normal operation, the potential of the electrode 305 connected with a signal line 106 is lower than the potential of the electrode 306 connected with the photodiode 103. That is to say, the electrode 305 is a source electrode and the electrode 306 is a drain electrode. Accordingly, the gate threshold voltage changes little because of the control electrode 331, which does not interfere with detection of signal charge.

The description provided with reference to FIGS. 9A and 9B is applicable to the configuration illustrated in FIGS. 12 and 13. Specifically, the control electrode 331 covers the entire channel end 342 on the side of the electrode 306 from end to end. This configuration effectively releases negative charge of static electricity. The control electrode 331 may partially cover the channel end 342 in another example.

The control electrode 331 does not cover but is distant from the other channel end 341. This configuration achieves small interference in reading the signal charge in normal operation. In an example, the end of the control electrode 331 on the side of the electrode 305 is located closer to the channel end 342 than to the channel end 341. This configuration more effectively reduces the interference in reading the signal charge.

Furthermore, the configuration illustrated in FIG. 10 is applicable to the configuration of FIGS. 12 and 13. That is to say, the control electrode 331 is provided on a layer closer to the electrode 306 than the lower electrode 308. In other words, the control electrode 331 is provided on a layer upper than the electrode 306 and lower than the lower electrode 308. Further, the photodiode 103 can be a Schottky diode as illustrated in FIG. 11.

The configuration including a control electrode in this embodiment is applicable to an image sensor for light having a wavelength different from X-rays, such as visible light. In addition, this configuration is applicable to not only image sensors but also other devices that include an element having rectification characteristics and a thin film transistor connected with a lower electrode of the element and in which the source and the drain of the thin film transistor are interchanged in between normal operation and discharge operation.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A device comprising:
   a first element having rectification characteristics that allow electric current to flow from an upper electrode to a lower electrode;
   an n-channel thin film transistor including a semiconductor film, a gate electrode, a first signal electrode, and a second signal electrode; and
   a control electrode facing the gate electrode with the semiconductor film interposed therebetween,
   wherein the second signal electrode is connected with the lower electrode,
   wherein the control electrode is connected with the lower electrode,
   wherein at least a part of a first channel end on the first signal electrode side of the semiconductor film is located within a region of the control electrode, when viewed planarly,
   wherein a second channel end on the second signal electrode side of the semiconductor film is distant from the control electrode, when viewed planarly, and
   wherein the first channel end and the second channel end of the semiconductor film are disposed between distal ends of the gate electrode, when viewed planarly.

2. The device according to claim 1, wherein the first element is a photodiode.

3. The device according to claim 1, wherein the semiconductor film is an oxide semiconductor film.

4. The device according to claim 1, wherein the gate electrode is disposed lower than the semiconductor film.

5. The device according to claim 1, wherein the entire first channel end is located within the region of the control electrode, when viewed planarly.

6. The device according to claim 1, wherein an end on the second channel end side of the control electrode is closer to the first channel end than to the second channel end.

7. The device according to claim 1, wherein the control electrode and the lower electrode are made of the same material and disposed on the same layer.

8. The device according to claim 1, wherein the control electrode is disposed on a layer between the layer of the lower electrode and the layer of the first signal electrode.

9. A device comprising:
   a first element having rectification characteristics that allow electric current to flow from a lower electrode to an upper electrode;
   an n-channel thin film transistor including a semiconductor film, a gate electrode, a first signal electrode, and a second signal electrode; and
   a control electrode facing the gate electrode with the semiconductor film interposed therebetween,
   wherein the second signal electrode is connected with the lower electrode,
   wherein the control electrode is connected with the lower electrode, wherein a first channel end on the first signal electrode side of the semiconductor film is distant from the control electrode, when viewed planarly, wherein at least a part of a second channel end on the second signal electrode side of the semiconductor film is located within a region of the control electrode, when viewed planarly, and wherein the first channel end and the second channel end of the semiconductor film are disposed between distal ends of the gate electrode, when viewed planarly.

10. The device according to claim 9, wherein the first element is a photodiode.

11. The device according to claim 9, wherein the semiconductor film is an oxide semiconductor film.

12. The device according to claim 9, wherein the gate electrode is disposed lower than the semiconductor film.

13. The device according to claim 9, wherein the entire second channel end is located within the region of the control electrode, when viewed planarly.

14. The device according to claim 9, wherein an end on the first channel end side of the control electrode is closer to the second channel end than to the first channel end.

15. The device according to claim 9, wherein the control electrode and the lower electrode are made of the same material and disposed on the same layer.

16. The device according to claim 9, wherein the control electrode is disposed on a layer between the layer of the lower electrode and the layer of the second signal electrode.

* * * * *